United States Patent [19]
Peterson

[11] Patent Number: 5,574,415
[45] Date of Patent: Nov. 12, 1996

[54] METHOD OF FABRICATING MICROWAVE INTERCONNECTS AND PACKAGING AND THE INTERCONNECTS AND PACKAGING

[76] Inventor: Robert K. Peterson, 3802 Keystone, Garland, Tex.

[21] Appl. No.: 897,174

[22] Filed: Jun. 11, 1992

[51] Int. Cl.[6] ........................................... H01P 3/08
[52] U.S. Cl. ............................. 333/238; 333/243
[58] Field of Search ..................... 333/238, 246, 333/33, 243, 244, 116, 1, 247; 174/117 FF, 36; 29/829

[56] References Cited

U.S. PATENT DOCUMENTS

| | | | |
|---|---|---|---|
| 4,673,904 | 6/1987 | Landis | 333/238 |
| 5,008,639 | 4/1991 | Pavio | 333/238 X |
| 5,068,632 | 11/1991 | Champean | 333/238 |

*Primary Examiner*—Robert J. Pascal
*Assistant Examiner*—Ali Neyzari

[57] ABSTRACT

A multilayer microwave structure for digital, power, RF and other interconnects wherein the metal (3, 7) and insulator (9) structure is built up in additive sequential steps over a base (5). Hermeticity within the structure is provided by forming an oxide layer (65) within the insulator portion of the structure which contacts the metal at all perimeter portions thereof.

28 Claims, 5 Drawing Sheets

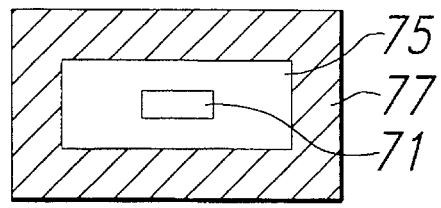
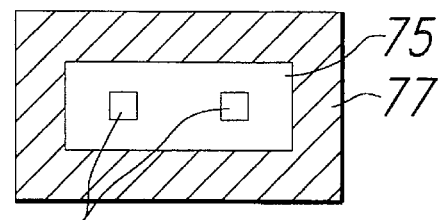
Fig. 8    Fig. 9
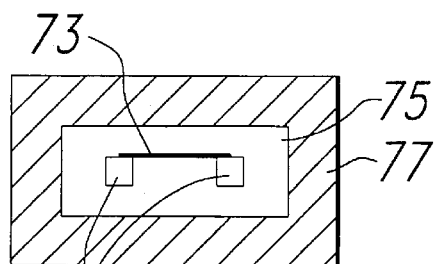
Fig. 10
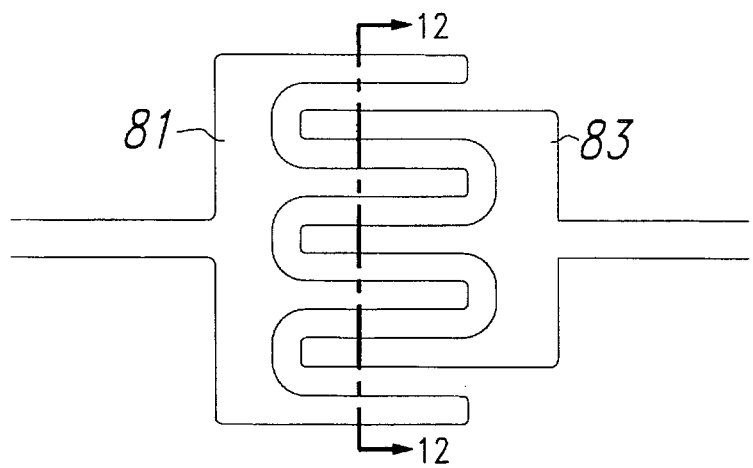
Fig. 11
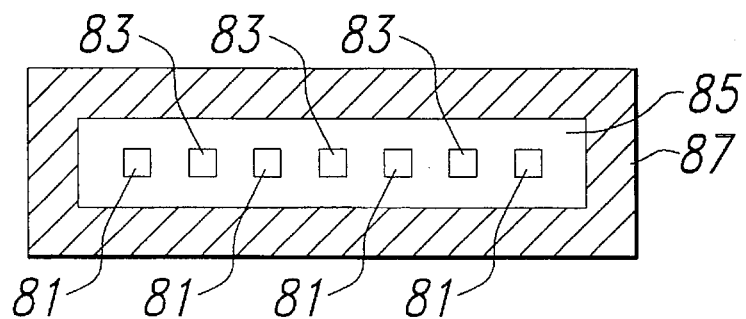
Fig. 12

METHOD OF FABRICATING MICROWAVE INTERCONNECTS AND PACKAGING AND THE INTERCONNECTS AND PACKAGING

BACKGROUND OF THE INVENTION

1. Field of the Invention

This invention relates to interconnect, passive component and packaging structures for use primarily in conjunction with microwave enclosures with internal interconnects and microwave passive components and a method of fabricating such interconnect, component and packaging structures.

2. Background and Brief Description of the Prior Art

Single and multiple device RF packaging is typically characterized by a separate package into which devices, subassemblies and interconnects are mounted. Since the interconnects are not integrated into the package, there is a resulting size and performance loss. Characteristically, a RF interconnect is in an open microstrip configuration and shares an interconnect layer with power and other interconnects. Extra space is therefore required and RF isolation is compromised. This is increasingly true in the case of functions with complex interconnect requirements which cannot be easily packaged with the single level interconnect.

The dielectrics of choice are primarily polymer (organic) or ceramic (inorganic). These materials usually degrade thermal performance and provide RF leakage paths through their continuous layer.

The handling of individual microwave circuit packages individually increases the complexity of the manufacturing flow by requiring many individual setup actions, whether manual or automated. Also, the installation of hermetic feedthroughs in metal packages is expensive and requires additional interconnects during assembly. Ceramic packages further require soft mechanical interfaces to prevent breakage.

Many approaches to the problem of packaging and interconnect exist in the prior art, some of which are, in the case of hermetic packages, for example, a metal package with glass-to-metal seal or planar ceramic feedthroughs or a cofired ceramic package with single or multiple level interconnect. In the case of non-hermetic packages, there is, for example, a plastic package with a metal leadframe. The interconnect structure can be, for example, a thin film ceramic or Teflon (polytetrafluoroethylene) microstrip with wirebond or ribbon interconnect or a thickfilm multilayer for digital high density. However, these prior art approaches suffer from one or more of the above noted problems.

In the pursuit of improvements in the packaging techniques for microwave circuits, it must always be borne in mind that microwave frequencies require great precision in dimensioning and location of elements and demand specialized grounding configurations, thereby placing very severe restrictions upon the available procedures.

SUMMARY OF THE INVENTION

In accordance with the present invention, microwave enclosures for integral interconnects and passive microwave components are fabricated by an additive sequential layer build-up of the final desired structure to minimize the problems inherent in the prior art as described above and to provide a significantly higher degree of control over dimensioning, location of the microwave elements and the ability to integrate power, control, cooling and other support elements.

Briefly, there is provided a multiple layered structure that forms the base of a microwave enclosure. A cover to provide RF shielding or hermeticity may be added by a number of conventional means. The base is configured using a number of stacked layers that may be all metal, all dielectric or combined metal and dielectric. The metal to dielectric interface within internal layers is perpendicular to the plane of the layer. Feature size, spacing and accuracy are limited only by available manufacturing technology. The actual configuration of each layer will vary with each specific application. Some of the interconnect features that may be incorporated within the layered structure are a rectangular coaxial line, a microstrip line, layer interfaces, overlay couplers, high density control, general shielding, power distribution and thermal conducting paths. Other features can be envisioned by those skilled in the art of microwave enclosure design.

Solid metal layers can be any metal which can be adheringly disposed on a base and successive layers and would include, but not be limited to, aluminum, copper or other conventional packaging materials for benign environments or molybdenum, kovar or other low coefficient of thermal expansion metal systems. Solid dielectric can be any dielectric material which can be adheringly disposed on a base and successive layers and would include, but not be limited to ceramic, such as, for example, $Al_2O_3$ or polymer-based materials, such as epoxy/glass composites. Combined metal and dielectric layers will consist, for example, of a platable metal, such as copper, and a polymer-like epoxy or condensation polyimide. If hermeticity is required between two layers in the structure, a thin inorganic layer, such as, for example, silicon dioxide, may be added and selectively etched at the interface.

The invention also relates to a method of fabricating a microwave enclosure with integral interconnects which comprises the steps of providing a multilayer base that is used with a conventional cover. The multilayer base can be fabricated with the addition of a number of sequential layers with appropriate patterning, etching and backfilling of metal and/or dielectric material on a metal or dielectric sheet. The interlaced metal and dielectric in each layer forms the microwave elements, other circuit elements and interfaces to adjacent layers. Fabrication of any layer is completed in the following sequence:

1. sputter a thin metal layer on a sheet or prior layer, if there be one for adherence thereto of plated metal or if the sheet or prior layer contains any dielectric.
2. apply resist, expose resist, plate the metal pattern onto the exposed sputtered metal to greater than the desired thickness, remove the resist and etch away exposed sputtered metal.
3. add uncured dielectric in regions from which resist is removed to greater than the desired thickness for backfilling and cure.
4. grind metal/dielectric surface to establish layer thickness of metal and dielectric.

Before the sputtering step or after the planarizing step, a layer of inorganic material, such as, for example, silicon dioxide, silicon nitride, a hermeticity providing material, etc. can be sputtered onto the planarized surface with patterning thereof taking place in standard manner using resist, patterning of resist and etching to provide layer-to-layer interconnect continuity.

Alternatively, a layer of resistive material can be deposited before the sputtering step or after the planarizing step by sputtering or the like, with this layer being patterned in standard manner as discussed above. The resistance provided by the resistive material is controlled by the thickness of the resistive material and/or the patterning thereof. A preferred resistive material is a nickel/iron alloy.

Each of one or multiple layers which are formed in this manner has alternating metal and dielectric with essentially vertical separation boundaries. Resist and imaging technology supports layers up to 4 mils in thickness with edge location accuracy at well less than a mil. Grinding techniques will establish layer thickness control at well less than a mil also. These precision features allow implementation of repeatable microwave devices. Utilization of multiple layers allows intricate precision geometries for microwave transitions.

A 50 ohm transmission line in the plane of the layers is provided by creating a rectangular metal tube that contains a rectangular conductor (normally centered) and dielectric material. An initial layer is solid metal. Subsequent layer(s) add metal wall sections with dielectric therebetween. Another layer continues the wall sections, adds the rectangular conductor and is completed with dielectric. Additional wall and dielectric layers are added. A final solid metal layer completes the rectangular coaxial transmission line.

A conventional stripline structure is formed by appropriately adjusting dimensions and eliminating the wall elements as in the above described transmission line.

A circular coaxial structure that is normal to the circuit layers is provided by creating subsequent layers with a small circular conductor that is surrounded by a dielectric ring and a circular metal feature.

To one skilled in the art, transitions from a planar rectangular coaxial line to a normal circular coaxial line are provided using unique layer patterns. Multiple layers may be utilized in the transition region to enhance RF performance. The outer conductor or ground structure can be continuous with no breaks.

Other shapes of transmission lines can be created using the multilayer patterning approach as described above.

A Wilkinson power divider is incorporated in either stripline or rectangular coaxial transmission lines. The 50 ohm conductor is divided into two 70 ohm conductors that are connected by a resistive material after one quarter of a wave length. The two conductors are then step transitioned to 50 ohm lines.

Interdigitated or edge coupled filters are provided in a stripline configuration. Walls are used to shield the function. An interdigitated or edge coupled pattern is created in a layer in a conventional fashion.

An overlay coupler is provided by separating two offset stripline transmission lines by a specific dimension. This is accomplished with three successive layers, the first being a conductor, the second being a dielectric layer and the third being the second conductor. The performance of the coupler is defined by conventional means and is established with dielectric material spacing and properties and the amount of overlap of the two conductors.

Additional RF devices not specifically described above can also be provided by those skilled in the art using the above described principles.

Additional microwave packaging applications, such as nonhermetic planar interconnect structures, can also be provided by those skilled in the art by using the principles described for a microwave enclosure.

BRIEF DESCRIPTION OF THE DRAWINGS

FIG. 8 is a cross sectional view taken along the line 8—8 of FIG. 7;

FIG. 9 is a cross sectional view taken along the line 9—9 of FIG. 7;

FIG. 10 is a cross sectional view taken along the line 10—10 of FIG. 7;

FIG. 11 is a top view of an interdigitated filter formed on a single layer in accordance with the present invention; and FIG. 12 is a cross sectional view taken along the line 12—12 of FIG. 11.

DESCRIPTION OF THE PREFERRED EMBODIMENTS.

Figure 1:
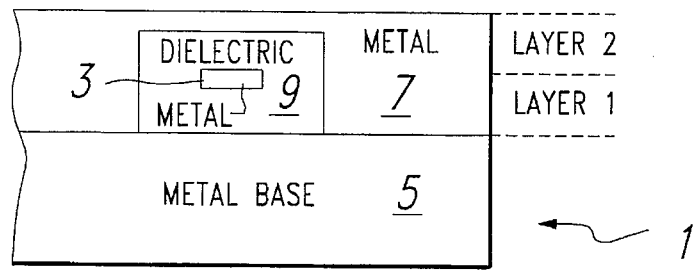
FIG. 1 is a cross section of a microwave device in accordance with a first embodiment of the present invention.
Figure 2A:
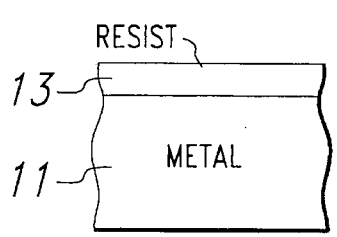
FIGS. 2A to 2L are a process flow for fabricating the device of FIG. 1 in accordance with the present invention.
Figure 2B:
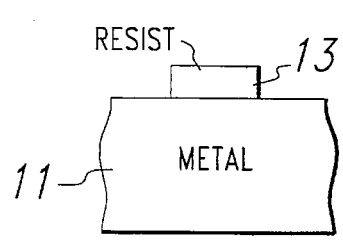
Figure 2C:
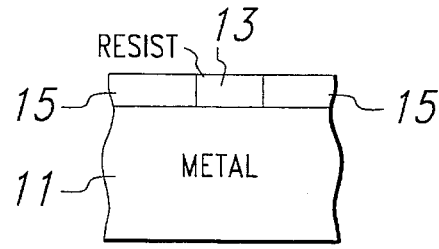
Figure 2D:
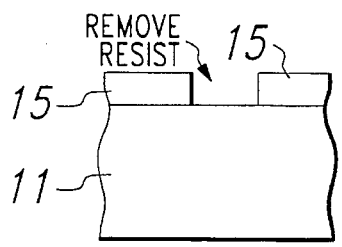
Figure 2E:
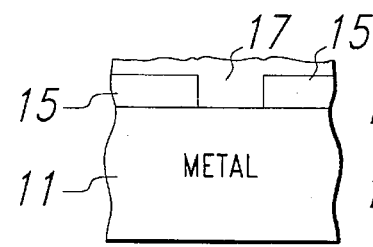
Figure 2F:
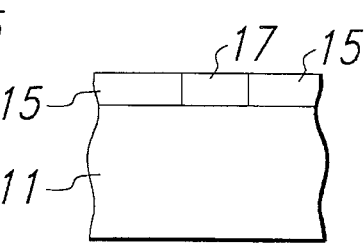
Figure 2G:
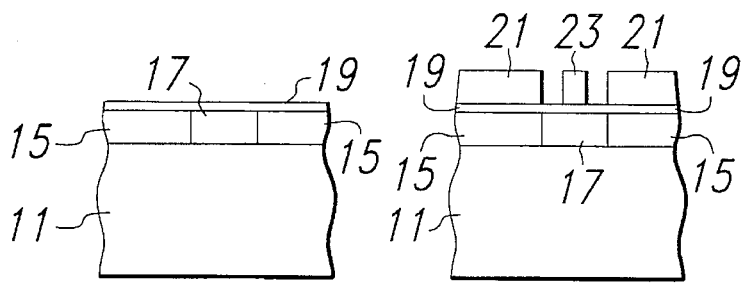
Figure 2H:
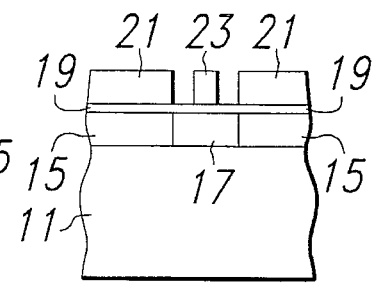
Figure 2I:
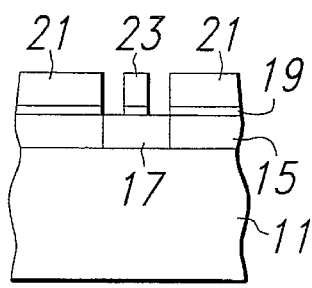
Figure 2J:
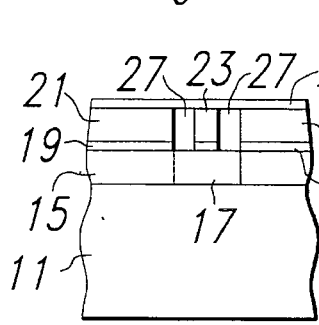
Figure 2K:
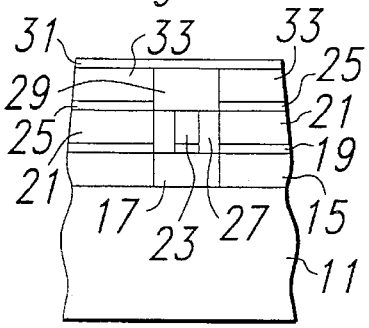
Figure 2L:
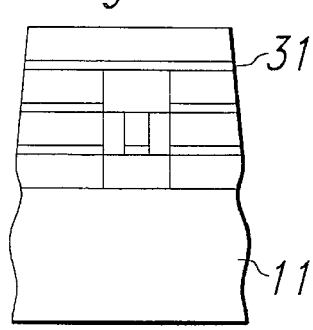

Referring first to FIG. 1, there is shown a first embodiment of a microwave structure 1 with a buried conductor 3 and metal shielding therefor composed of the metal base 5 and built up metal 7 with dielectric 9 surrounding the buried conductor. The metal base 5 can also be a dielectric with a metallized surface.

One procedure for fabrication of the structure of FIG. 1 in accordance with the present invention is provided, as shown in FIG. 2 using standard processing steps individually known in the art. In accordance with this procedure, initially, the metal base 11 is provided having a flat upper surface The metal is selected in accordance with particular packaging constraints. Aluminum, copper and steels are conventionally used. When low coefficients of thermal expansion are desired for compatibility with gallium arsenide or silicon devices, Kovar or other similar materials are generally used. Thin adhesion layers, such as chrome, may be used throughout the process using plasma deposition. A resist 13 is then deposited on the upper surface of the metal base 11 as shown in FIG. 2A, patterned as shown in FIG. 2B in standard manner and a metal, typically copper or aluminum, layer 15 is deposited onto the exposed metal 11 as shown in FIG. 2C. Metal deposition is by wet plate process. The remaining resist 13 is then removed in standard manner as shown in FIG. 2D and metalization from adhesion layers is etched away. The region formerly occupied by resist 13 is now filled with a dielectric material 17, such as, for example, epoxy or condensation polyimide as shown in FIG. 2E and the surface including the metal layer 15 and the dielectric layer 17 is ground back to provide a planar surface as shown in FIG. 2F. The dielectric material may be sprayed as a liquid or applied as a film. Various lamination techniques can be employed to obtain a continuous cured dielectric layer. A thin layer of metal 19, typically copper or aluminum, is then deposited over the FIG. 2F planar surface as shown in FIG. 2G. The procedures discussed above of providing a patterned resist and then plating up a layer of metal 15 is repeated to provide metal regions 21 above the metal regions 15 as well as the central conductor region 23 spaced from the metal regions 21 as shown in FIG. 2H. The exposed portion of the metal layer 19 is then removed by etching to electrically isolate the metal layer 15 and 21 from the conductor 23 as shown in FIG. 2I. A dielectric 27 is then disposed in the region between the conductor 23 and the layers 15, 19, 21 using the procedures set forth above in connection with FIGS. 2E to 2G with the metal layer 25, which is provided in the same manner as layer 19, disposed over the metal layers 21 and 23 and dielectric region 27 as shown in FIG. 2J. The procedures discussed above with reference to FIGS. 2H to 2J are repeated except that the center conductor 23 is omitted to provide the structure as shown in FIG. 2K with metal layer 33 over the metal layers 19 and 25, dielectric 29 over the conductor 23 and dielectric 27 and a layer of metal 31 on the top surface. A layer of metal 35 is then plated onto the metal layer 33 to provide the structure of FIG. 1.

Several structures of the type shown in FIG. 1 can be fabricated simultaneously on a single metal base 5 in the same manner as in the fabrication of semiconductors with the individual structures tested while on the base. The individual structures can then be scribed and separated in standard manner with only those structures that tested positive being sent on for further fabrication.

While a buried conductor has been shown in FIG. 1, it should be understood that the above described techniques can be used to fabricate other components, such as, for example, a multilayer interconnect, resistors, inductors, electrostatic and thermal shields, hermetic barriers, couplers and the like with appropriate interconnects between components, where required, using the fabrication techniques described herein.

Figure 3:
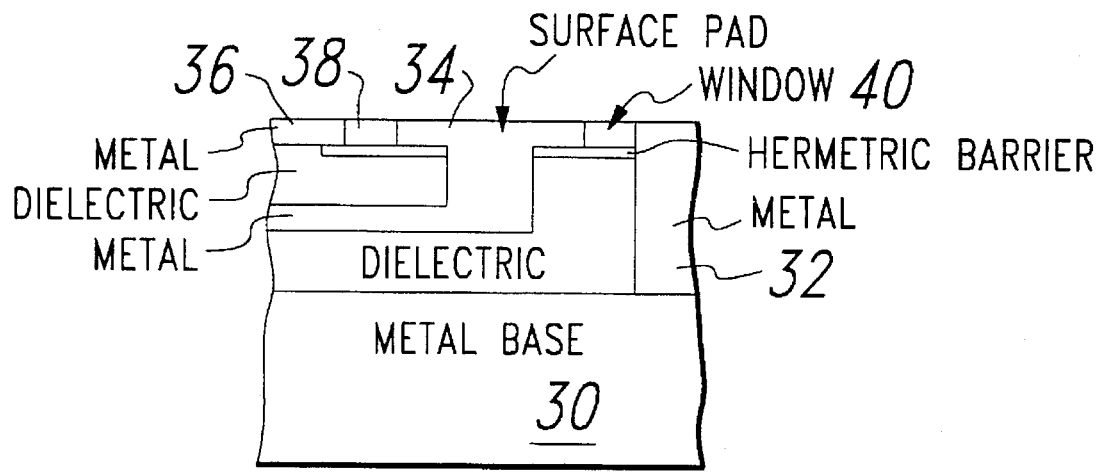
FIG. 3 is a cross section of a device in accordance with a second embodiment of the present invention.

Referring now to FIG. 3, there is shown an interconnect structure between the base 30 and the layers using solid walls 32. The isolated pad at the surface of the circuit and via 34 which is isolated by dielectric regions 38 and 40 can be used for wirebond or other interface. Metal 36 forms the top ground conductor of the rectangular coaxial line. The dimensions of the via, surface pad and dielectric entry cavity into the box can be varied for inductive and capacitive control for impedance matching. Impedance matching can be designed for all layer-to-layer and layer-to-surface transitions. The circuit of FIG. 3 is built up using the techniques described in conjunction with the embodiment of FIGS. 1 and 2.

Figure 4:
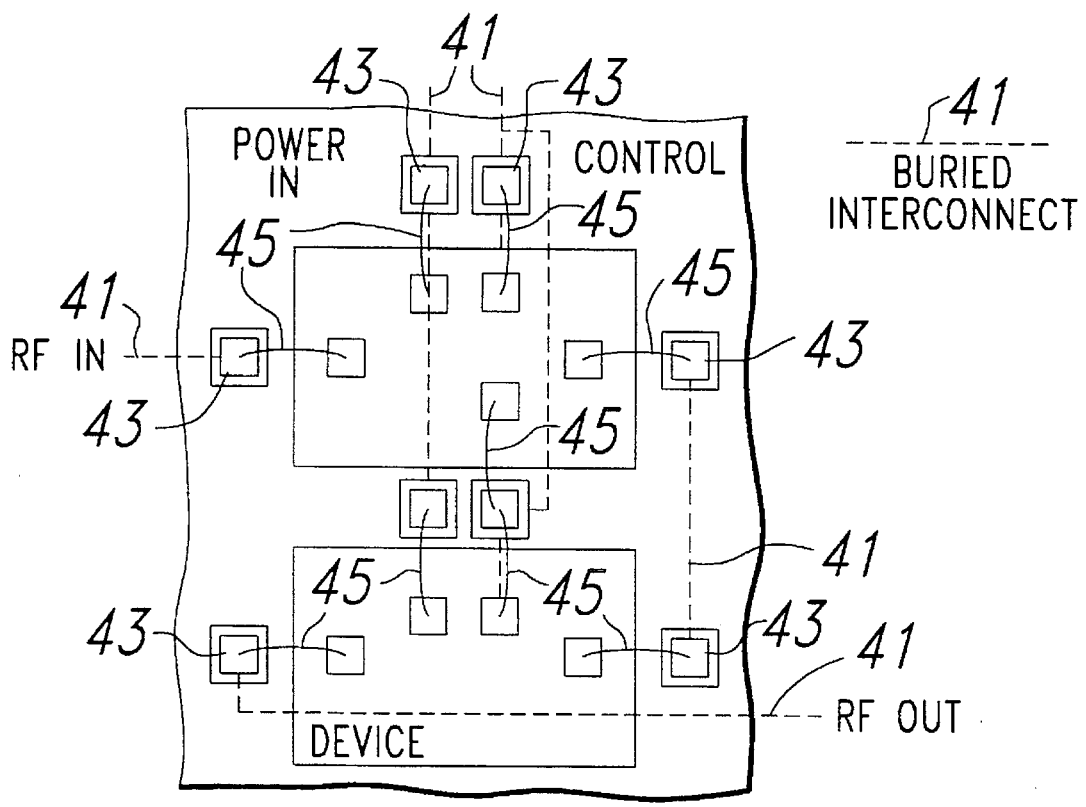
FIG. 4 is a top view of a further microwave circuity in accordance with the present invention.

Referring now to FIG. 4, there is shown a top view of a microwave circuit fabricated according to the above described procedures wherein all interconnects, power, control, input and output 41 are buried beneath the device mount layer with only small surface pads 43 required for bondwires 45. Not only is RF isolation achieved, but surface area reductions of up to 2:1 are obtainable by eliminating surface layer routing of the interconnects. Also, a superior thermal path is achieved.

Solid metal can be left in the interconnect to specifically align with the high thermal dissipation areas of devices, thereby providing excellent thermal sinking. This permits ideal placement of thermal spreaders without blocking out routing under the devices.

Routing density with a single routing layer and a surface layer is limited to simple functions. A limited number of surface jumpers can be used at the expense of surface area. RF and other functions, such as spiral inductors, can be designed into the structure. As the interconnect pattern becomes more complex (i.e., a large multi-device function or one with digital processing), a third interconnect layer can be added to provide an orthogonal routing layer pair. For rf transmission line crossover, addition of another layer can provide total isolation, if necessary.

The base 5 or 35 can be formed of a material other than solid metal. Metallized polymer and ceramic sheet are two examples of materials that can replace the metal of the base. It is understood that all materials used in connection with the devices fabricated in accordance with the present invention will preferably have similar coefficients of thermal expansion.

Figure 5A:
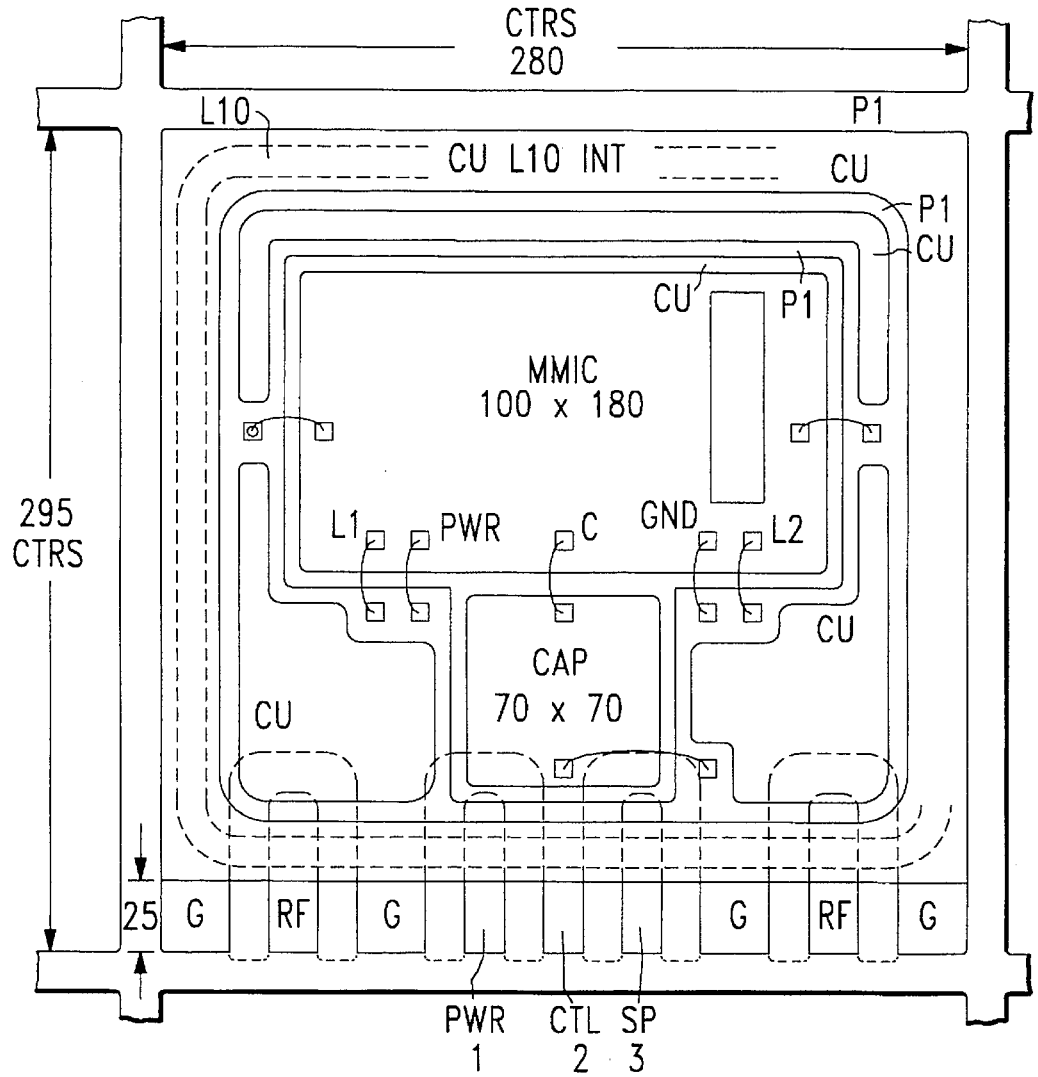
FIG. 5A is a top view of a further microwave circuity in accordance with the present invention.
Figure 5B:
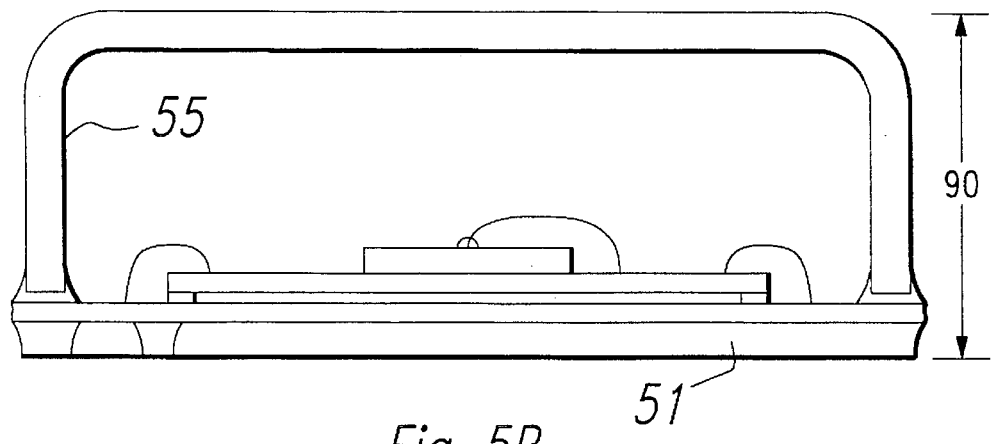
FIG. 5B is a cross section of the circuit of FIG. 5A.

With reference to FIGS. 5A and 5B, there is shown a two or three layer circuit manufactured on a thin (10 to 15 mil) metal (Cu) base 51. The I/O for the package is viaed to the base where a chemical milling process isolates the pads for a coplanar RF and surface mount interface. A suitable process removes the polymer around the interface pads. A drawn lid 55 is used to protect the devices.

Figure 6:
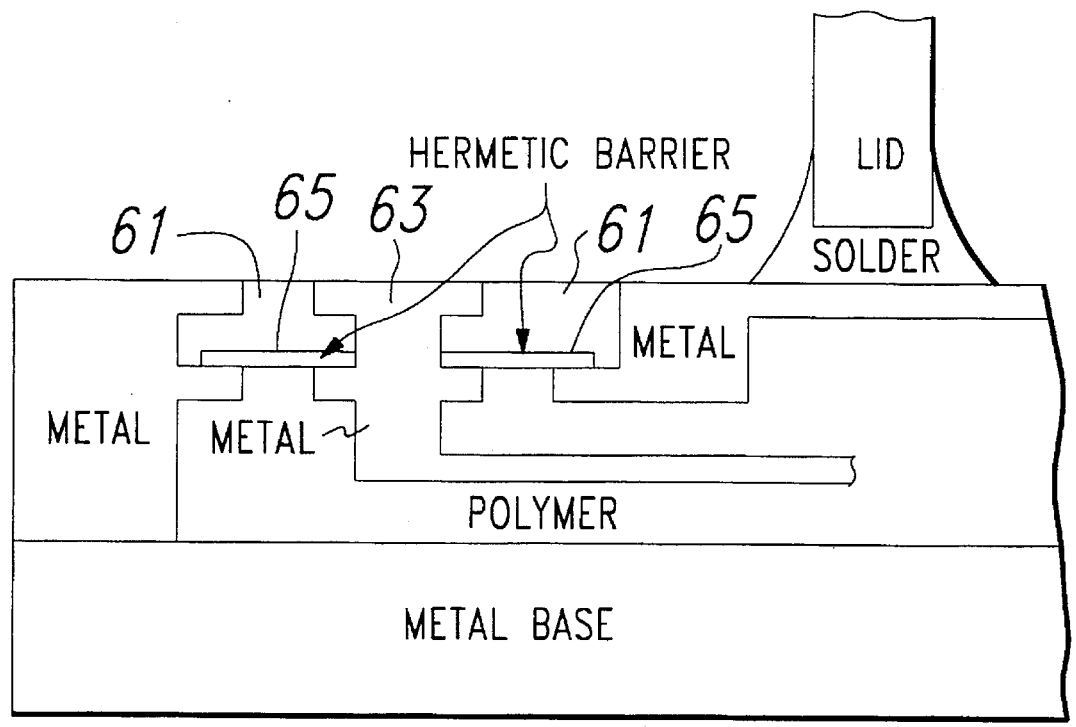
FIG. 6 is a cross section of a device in accordance with a third embodiment of the present invention.
Figure 7:
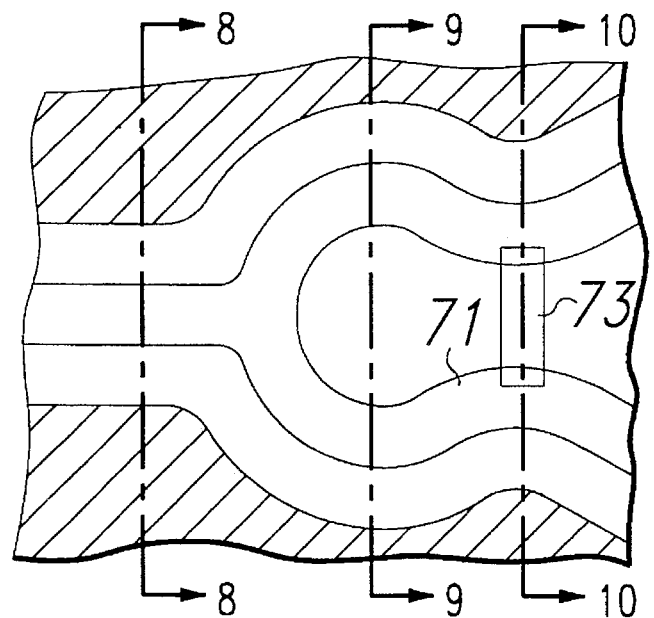
FIG. 7 is a top view of a Wilkinson divider formed on a single layer in accordance with the present invention.

When a hermetic enclosure is required, the polymer (typically polyimide) is not a suitable moisture barrier. The problem is resolved as shown in FIG. 6 wherein a stacked via 63 through a ground plane is utilized, the exposed polymer 61 being limited to donut shaped regions around the via. This is accomplished at the surface or in a buried layer. A suitable dielectric oxide or nitride 65 is processed to provide a moisture barrier across the exposed polymer donut. The oxide or nitride can be a continuous layer except for via holes or may be etched into donuts itself. A lid (not shown) would be soldered or welded in place over the devices.

Since the circuit manufacturing process can build product larger than typical packages or subassemblies, multiple parts can be imaged on a panel. With the chemical milling process or other suitable process, these parts can be individualized to only remain connected with a polymer web. This permits these parts to be accurately self-tooled for automated assembly. Use of a laser or other method can separate the parts when desired.

Referring now to FIGS. 7 to 10, there is shown a Wilkinson divider formed as a layer of a device in accordance with the present invention. As can be seen in FIGS. 8 to 10, the Wilkinson divider comprises a metal pattern 71 which splits from a single branch to a pair of branches in standard manner for such dividers. The pattern 71 is surrounded on all sides thereof by dielectric 75. While only one layer of dielectric is shown both below and above the pattern 71, it should be understood that several layers of dielectric 75 can be disposed below and/or above the pattern 71 with elements such as resistors, passive functions, thermal member such as heat sinks, etc. disposed on one or more of these layers. The elements on the layers can be interconnected through vias as described above. For example, the Wilkinson divider shown if FIG. 7 can be coupled to the buried conductor shown in FIG. 1 which would be on the same layer or on a different layer and connected through a via between the two layers. A resistive element 73 is shown connected across the diverging legs of the Wilkinson divider. A metal case 77 is built up around the entire structure in the same manner as described above with respect to FIG. 2.

Referring now to FIGS. 11 and 12, there is shown an interdigitated filter fabricated in accordance with the present invention. The filter includes two sets of fingers 81 and 83 formed on an electrically insulating layer with electrically insulating material having been backfilled between the fingers of the filter. The dielectric 85 is shown in FIG. 12 disposed below, above and between the fingers of the filter. As stated above, additional layers of insulation can be disposed above or below the layer containing the filter with other elements thereon which can be interconnected through vias with elements on the same layer being interconnected in standard manner by conductive runs thereon. A metal case 87 is built up around the entire structure in the same manner as described above with respect to FIG. 2.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

I claim:

1. A microwave circuit which comprises:
   (a) a base having an electrically conductive metallic surface;
   (b) a metal region having plural distinct layers disposed over said base;
   (c) a dielectric region having plural layers disposed over said base and contiguous on sides thereof with said metal region;
   (d) a metal via extending from a surface of said dielectric region remote from said base into said dielectric region; and
   (e) an hermetic barrier buried in said dielectric region and contacting said metal region to hermetically isolate the portions of said dielectric region on opposing sides thereof.

2. A circuit as set forth in claim 1 wherein said base is an electrically conductive metal.

3. A method of fabricating a microwave circuit which comprises the steps of:
   (a) providing a base having a flat surface;
   (b) providing a metal region over and contiguous to said base;
   (c) forming a dielectric region over said base and contiguous on sides thereof to said metal region; and
   (d) forming a metal via extending from a surface of said dielectric region remote from said base into said dielectric region.

4. The method of claim 3 further including forming a hermetic barrier buried in said dielectric region and contacting said metal region to hermetically isolate the portions of said dielectric region on opposing sides thereof.

5. The method of claim 3 wherein said base has an electrically conductive metal surface.

6. The method of claim 4 wherein said base has an electrically conductive metal surface.

7. A method of fabricating a microwave circuit which comprises the steps of:
   (a) providing a base having a flat surface;
   (b) forming a portion of a first region of metal over said base;
   (c) forming a portion of a region of dielectric material over said base and contacting said first region of metal;
   (d) forming a second region of metal over said portion of a region of dielectric material and over said first region of metal;
   (e) forming the remainder of said region of dielectric material over said second region of metal; and
   (f) forming the remainder of said first region of metal over said portion of said first region of metal.

8. The method of claim 7 wherein said base has an electrically conductive metal surface.

9. A method of fabricating a microwave circuit which comprises the steps of:
   (a) providing a base having a flat surface;
   (b) building up a plurality of separate layers of metal over said base, at least one of said separate layers of metal being built up in a plurality of separate additive steps; and
   (c) building up a plurality of contiguous layers of dielectric over said base contiguous to layers of said metal.

10. A method of fabricating a microwave circuit which comprises the steps of:
    (a) providing a base having a metal surface;
    (b) building up a patterned layer of metal on said surface, the portions of said surface outside of said pattern being exposed;
    (c) disposing electrically insulative material on said exposed portions of said surface;
    (d) planarizing the combined surfaces of said patterned layer of metal and said electrically insulative material;
    (e) forming a thin layer of metal over said planarized surfaces having sufficient thickness for plating thereon;
    (f) repeating steps (b) through (e) to form said microwave circuit.

11. The method of claim 10 further including the step of removing a portion of said thin layer of metal prior to step (f).

12. The method of claim 10 further including the step of forming a thin layer of metal over the planarized surface subsequent to step (f).

13. The method of claim 11 further including the step of forming a thin layer of metal over a planarized surface subsequent to step (f).

14. The method of claim 10 further including repeating step (f) more than once.

15. The method of claim 11 further including repeating step (f) more than once.

16. The method of claim 12 further including repeating step (f) more than once.

17. The method of claim 13 further including repeating step (f) more than once.

18. The method of claim 10 further including the step of forming a thick metal conductor layer over the topmost layer.

19. The method of claim 17 further including the step of forming a thick metal conductor layer over the topmost layer.

20. The method of claim 10 where said step of building up a patterned layer comprises the step of plating a metal onto said metal surface of said base.

21. The method of claim 13 where said step of building up a patterned layer comprises the step of plating a metal onto said metal surface of said base.

22. The method of claim 18 where said step of building up a patterned layer comprises the step of plating a metal onto said metal surface of said base.

23. The method of claim 19 where said step of building up a patterned layer comprises the step of plating a metal onto said metal surface of said base.

24. The method of claim 10 wherein a predetermined said repeated step of building up a patterned layer of metal in (b) includes the step of patterning said metal to form an electrical resistor of predetermined resistance value.

25. The method of claim 10, further including the step of forming a hermetic barrier over said patterned layer of metal.

26. The method of claim 24, further including the step of forming a hermetic barrier over said patterned layer of metal.

27. The method of claim 10 wherein said patterned layer of metal built up in said repeated step is a Wilkinson divider.

28. The method of claim 10 wherein said patterned layer of metal built up in said repeated step is an interdigitated filter.

* * * * *

UNITED STATES PATENT AND TRADEMARK OFFICE
CERTIFICATE OF CORRECTION

PATENT NO. : 5,574,415
DATED : November 12, 1996
INVENTOR(S) : Peterson

It is certified that error appears in the above-indentified patent and that said Letters Patent is hereby corrected as shown below:

On the title page, item [73], please add Assignee:
-- Texas Instruments Incorporated, Dallas, Texas --.

Before item [57] Abstract, insert " Attorney, Agent or Firm "
-- Rene' E. Grossman and Richard L. Donaldson --.

Signed and Sealed this

Fifteenth Day of July, 1997

Attest:

BRUCE LEHMAN

Attesting Officer

Commissioner of Patents and Trademarks